United States Patent
Menard et al.

(10) Patent No.: US 8,564,059 B2
(45) Date of Patent: Oct. 22, 2013

(54) HIGH-VOLTAGE VERTICAL POWER COMPONENT

(75) Inventors: Samuel Menard, Tours (FR); François Ihuel, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 38 days.

(21) Appl. No.: 13/037,694

(22) Filed: Mar. 1, 2011

(65) Prior Publication Data

US 2011/0210372 A1  Sep. 1, 2011

(30) Foreign Application Priority Data

Mar. 1, 2010  (FR) ..................................... 10 51437

(51) Int. Cl.
 *H01L 29/76* (2006.01)
 *H01L 29/94* (2006.01)
 *H01L 31/062* (2012.01)
(52) U.S. Cl.
 USPC .......................................... 257/335; 257/328
(58) Field of Classification Search
 USPC ................... 257/328–346, 506–510, E21.418
 See application file for complete search history.

(56) References Cited

U.S. PATENT DOCUMENTS

| | | | |
|---|---|---|---|
| 6,956,266 B1 * | 10/2005 | Voldman et al. | 257/371 |
| 7,999,312 B2 * | 8/2011 | Takaya et al. | 257/331 |
| 2004/0082140 A1 | 4/2004 | Yang | |
| 2004/0171220 A1 * | 9/2004 | Yang et al. | 438/270 |
| 2006/0267091 A1 * | 11/2006 | Takahashi | 257/341 |
| 2007/0117360 A1 | 5/2007 | Blanchard | |
| 2010/0025809 A1 | 2/2010 | Bowman | |

OTHER PUBLICATIONS

French Search Report dated Aug. 24, 2010 from corresponding French Application 10/51437.

* cited by examiner

*Primary Examiner* — Cuong Q Nguyen
(74) *Attorney, Agent, or Firm* — Wolf, Greenfield & Sacks, P.C.

(57) ABSTRACT

A high-voltage vertical power component including a lightly-doped semiconductor substrate of a first conductivity type and, on the side of an upper surface, an upper semiconductor layer of the second conductivity type which does not extend all the way to the component periphery, wherein the component periphery includes, on the lower surface side, a ring-shaped diffused region of the second conductivity type extending across from one third to half of the component thickness; and on the upper surface side, an insulated ring-shaped groove crossing the substrate to penetrate into an upper portion of ring-shaped region.

32 Claims, 2 Drawing Sheets

HIGH-VOLTAGE VERTICAL POWER COMPONENT

CROSS REFERENCE TO RELATED APPLICATIONS

This application claims the priority benefit of French patent application number 10/51437, filed on Mar. 1, 2010, entitled "HIGH-VOLTAGE VERTICAL POWER COMPONENT," which is hereby incorporated by reference to the maximum extent allowable by law.

BACKGROUND OF THE INVENTION

1. Field of the Invention

The present invention relates to a vertical power component capable of withstanding a high voltage (greater than 500 V), and more specifically to the structure of the periphery of such a component.

2. Discussion of the Related Art

FIGS. 1, 2, and 3 show various ways to form the periphery of a high-voltage vertical power component to enable it to withstand high voltages.

These drawings show a triac comprising a lightly-doped substrate 1, currently on the order of from $10^{14}$ to $10^{15}$ atoms/cm$^3$, having its upper and lower surfaces comprising P-type doped layers or regions 3 and 5. Upper layer 3 contains a heavily-doped N-type region 4 and lower layer 5 contains a heavily-doped N-type region 6 in an area substantially complementary to that taken up by region 4. An electrode A1 coats the lower surface of the component and is in contact with regions 5 and 6. An upper surface electrode A2 is in contact with region 4 and a portion of region 3. In this region 3 is also formed a heavily-doped N-type region 8 of small extent and a gate electrode G covers region 8 and a portion of region 3. Thus, whatever the biasing between electrodes A1 and A2, if a gate control is provided, the component becomes conductive. The conduction occurs from electrode A1 to electrode A2 through a vertical thyristor comprising regions 5, 1, 3, and 4, or from electrode A2 to electrode A1 through a vertical thyristor comprising regions 3, 1, 5, and 6. The thickness and the doping level of substrate 1 are calculated so that the triac, in the off state, can withstand high voltages, for example, voltages greater than from 600 to 800 volts. It should then be avoided for breakdowns to occur at the ends of the components.

FIG. 1 shows a so-called mesa peripheral structure for avoiding such breakdowns. A lateral ring-shaped trench deeper than P regions 3 and 5 is formed at the periphery of each of the two surfaces of the substrate. These trenches are filled with a passivation glass 9. In practice, trenches are initially formed on a silicon wafer between two components before dicing of the wafer into individual components. A lot of research has been carried out on such mesa-type vertical power components. If a breakdown occurs, it occurs in the areas where the PN$^-$ junctions cross isolated trenches 9. In the best conditions, that is, when the angle according to which the trenches filled with glass cross the junctions between the substrate and layers 3 and 5 is properly selected, and when the quality of the glass is optimized, a distance e1 between the edge of the component and the glassivation limit at least equal to 300 µm should be provided to obtain a breakdown voltage greater than 800 volts. This decreases by the same distance the surface area available for the power component electrodes; otherwise, for given surface areas of the electrodes, this increases the surface area of the component and thus its cost.

A specific disadvantage of mesa structures is that, given that the passivation glass never has the same thermal coefficient as silicon, the interface between glass and silicon does not age well and, in case of an incidental breakdown, if the voltage across the component exceeds the authorized limit, the component is no longer operative.

FIG. 2 shows another conventional power component periphery structure. A groove filled with a passivation glass is present on the upper surface side. The component is surrounded with a heavily-doped P-type diffused wall 12 formed from the upper and lower surfaces and the groove extends between wall 12 and P-type layer 3, substantially as shown. Thus, all voltage withstand areas are gathered on the upper surface side of the component. At the periphery of the junction between wall 12 and substrate 1, on the groove side, in the area designated with reference numeral 14, breakdowns may occur when lower electrode A1 is negative with respect to upper electrode A2 (so-called reverse breakdown); and at the periphery of the junction between substrate 1 and layer 3, on the groove side, in the area designated with reference numeral 16, breakdown voltages may occur when lower electrode A1 is positive with respect to upper electrode A2 (so-called forward breakdown).

This structure provides good results and simplifies the forming of lower electrode A1, but distance e2 between the edge of the component and the limit of electrode A2 is greater than in the previous case, for example, 350 µm to withstand a voltage greater than 800 volts. Further, as in the previous case, the interface between the silicon and the passivation glass remains an issue.

Further, this method requires a greater number of masks than that of the previous structure.

FIG. 3 shows a passivation structure in so-called "planar" technology. As in the case of FIG. 3, the structure is surrounded with a heavily-doped P-type ring-shaped wall at its periphery. To withstand the voltage, a distance is provided between the limit of P-type layer 3 and peripheral wall 20. If a breakdown occurs, it occurs in bending regions 23 of P well 3 or in region 24 of junction between P layer 5 and substrate 1.

An advantage of this structure is that a breakdown is not necessarily destructive for the component. However, this structure has the disadvantage of requiring a channel stop ring 22 at the periphery of the upper surface in region N1 between the limit of P region 3 and the limit of isolation wall 20. This results in the disadvantage of requiring a relatively high guard distance e3 between the component edge and the limit of electrode A2, for example, on the order of 370 µm to withstand a voltage greater than 800 volts.

SUMMARY OF THE INVENTION

A peripheral power component structure of smaller extension than the various known structures is thus needed.

There also is a need for such a structure, which avoids a degradation of the component in case of a very high incidental overvoltage causing a breakdown.

Thus, an embodiment of the present invention provides a high-voltage vertical power component comprising a lightly-doped semiconductor substrate of a first conductivity type and, on the side of an upper surface, an upper semiconductor layer of the second conductivity type which does not extend all the way to the component periphery, wherein the component periphery comprises, on the lower surface side, a ring-shaped diffused region of the second conductivity type extending across from one third to half of the component thickness; and on the upper surface side, an insulated ring-shaped groove crossing the substrate to penetrate into an upper portion of said ring-shaped region.

According to an embodiment of the present invention, the groove is laterally insulated by a silicon oxide layer and is filled with undoped silicon.

According to an embodiment of the present invention, the vertical power component forms a triac, wherein a first heavily-doped region of the first conductivity type extends in a portion of said upper semiconductor layer, said first region and a portion of said upper semiconductor layer being in contact with a first electrode; and the lower surface comprises a lower doped semiconductor layer of the second conductivity type, in which is formed a second region of the first conductivity type, substantially complementary to the first region when seen in projection.

According to an embodiment of the present invention, the groove has a width on the order of from 5 to 10 µm.

According to an embodiment of the present invention, the groove has a depth on the order of from 100 to 200 µm.

According to an embodiment of the present invention, the component is capable of withstanding a voltage greater than 800 volts, and the distance between the limit of said upper semiconductor layer and the component periphery is on the order of 250 µm.

The foregoing objects, features, and advantages of the present invention will be discussed in detail in the following non-limiting description of specific embodiments in connection with the accompanying drawings.

DETAILED DESCRIPTION

As usual in the representation of semiconductor components, the various drawings are not to scale.

Figure 1:
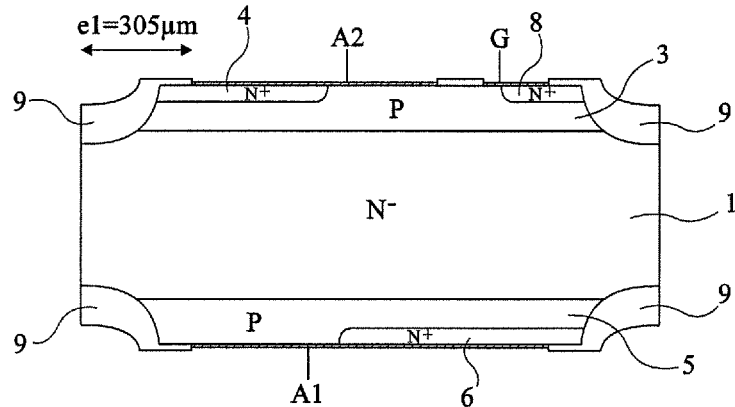
FIGS. 1 to 3 show various known structures of vertical power components.
Figure 2:
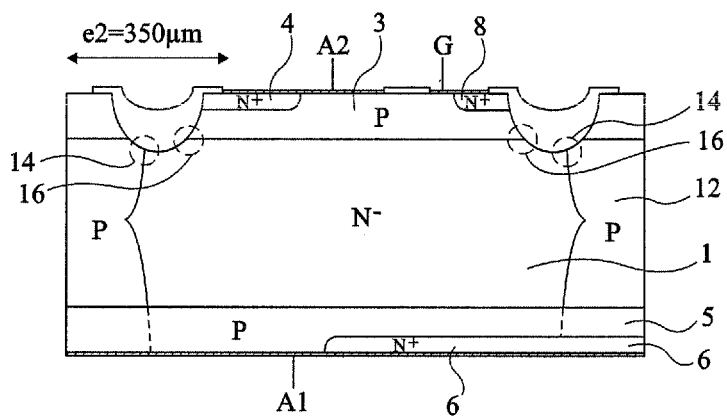
Figure 3:
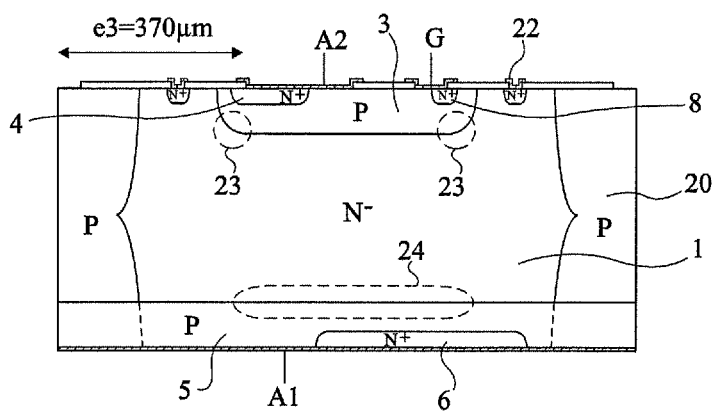
Figure 4:
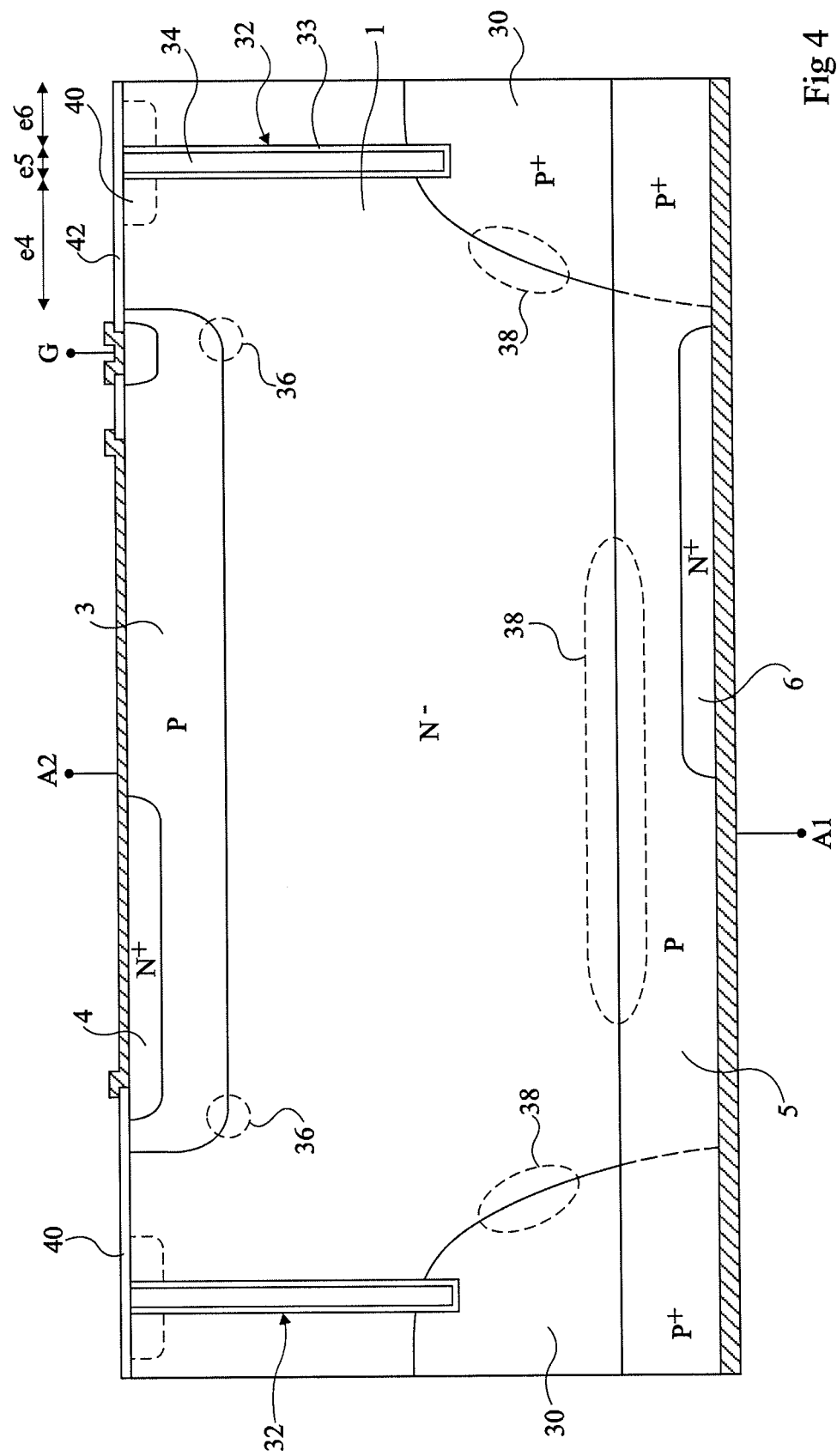
FIG. 4 shows an example of a vertical power component structure according to an embodiment of the present invention.

FIG. 4 shows a triac having its different elements designated with the same reference numerals as the corresponding elements of FIGS. 1, 2, and 3.

At the component periphery, on the lower surface side is a heavily-doped P-type diffused wall region 30 crossing P-type layer 5 and penetrating down to a given depth into substrate 1, for example, from one third to half of the thickness of this substrate.

On the upper surface side, at the component periphery, a deep straight groove 32 joins diffused region 30. Groove 32 has a width from 5 to 10 µm and is insulated. It for example comprises at its periphery an oxide layer 33 and undoped silicon 34 in its central portion.

On the upper surface side, P-type doped region 3 extends all the way to a distance e4 from the groove. The groove has a width e5 and the distance between the groove and the component edge is equal to e6.

An upper $SiO_2$ layer (42) coats all the component surfaces which are not taken up by a metallization.

In such a structure, forward breakdowns may occur in bending region 36 of P-type layer 3 and reverse breakdowns may occur in region 38 almost all along the lower junction formed by layer 5 and substrate 1.

Such a structure has a great number of advantages. On the one hand, diffused region 30 formed from the lower surface does not need to reach an upper diffused region and may extend down to a depth smaller than half the substrate thickness, for example, down to a thickness on the order of one third of the substrate thickness, for example, down to a depth on the order of 100 µm only.

Preferably, trench 32 extends down to a thickness on the order of 20 µm inside of diffused region 30.

In such a structure, given that the breakdowns which are likely to occur in the substrate depth, there is no need to provide channel stop regions. It can actually be acknowledged that the distance between the component periphery and the limit of region 3 may be on the order of 250 µm only, with a trench having a width on the order of 10 µm, to obtain a voltage greater than 800 volts. This value is much smaller than all the values of known devices.

On the other hand, an incidental breakdown caused by a very high overvoltage does not destroy the component.

A more heavily-doped N area 40 may be provided in the vicinity of the end of the groove on the upper surface side to control the extension of the space charge area (especially for the reliability of the forward junction) and avoid any surface inversion phenomenon.

Thus, the structure according to at least one embodiment of the present invention enables to significantly decrease the surface area taken up by the component periphery by efficiently withstanding breakdowns.

The present invention has been previously described in the case where the power component is a triac. It should be understood that a similar structure may apply to any other known type of vertical power component.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high-voltage vertical power component comprising:
a lightly-doped semiconductor substrate of a first conductivity type and, on a side of an upper surface, an upper semiconductor layer of a second conductivity type which does not extend all the way to a periphery of the component,
wherein the component periphery includes:
on a lower surface side, a ring-shaped diffused region of the second conductivity type extending to a depth between one third and one half of the component thickness; and
on an upper surface side, an isolated ring-shaped groove extending into the substrate to penetrate into an upper portion of said ring-shaped region,
wherein the groove is at least partially filled with undoped silicon, and
wherein a bottom surface of the undoped silicon is insulated from the ring-shaped diffusion region by an insulating material.

2. The high-voltage vertical power component of claim 1, wherein the insulating material comprises a silicon oxide layer.

3. The high-voltage vertical power component of claim 1, forming a triac, wherein:
a first heavily-doped region of the first conductivity type extends in a portion of said upper semiconductor layer, said first region and a portion of said upper semiconductor layer being in contact with a first electrode; and the lower surface comprises a lower doped semiconductor layer of the second conductivity type, in which is formed a second region of the first conductivity type, the second region being substantially complementary to the first region when seen in projection.

4. The high-voltage vertical power component of claim 1, wherein the groove has a width on the order of from 5 to 10 μm.

5. The high-voltage vertical power component of claim 1, wherein the groove has a depth on the order of from 100 to 200 μm.

6. The high-voltage vertical power component of claim 1, capable of withstanding a voltage greater than 800 volts, wherein a distance between a limit of said upper semiconductor layer and the component periphery is on the order of 250 μm.

7. The high-voltage vertical power component of claim 1, wherein the bottom surface of the undoped silicon being insulated from the ring-shaped diffusion region by the insulating material comprises the undoped silicon being electrically insulated from the ring-shaped diffusion region by the insulating material, and wherein the insulating material comprises an electrically insulating material.

8. An integrated circuit comprising:
a substrate, an annular portion of the substrate including an annular diffusion region formed adjacent to a portion of a lower surface of the substrate; and
an annular groove extending into the substrate in a direction of a thickness of the substrate, a first portion of the groove extending into the substrate without penetrating the annular diffusion region, a second portion of the groove penetrating the annular diffusion region, the groove being at least partially filled with undoped silicon,
wherein an insulating material insulates a bottom portion of the undoped silicon from the annular diffusion region formed adjacent to the portion of the lower surface of the substrate.

9. The integrated circuit of claim 8, wherein an interior of the groove is insulated from the substrate by the insulating material, and wherein the interior of the groove is at least partially filled with the undoped silicon.

10. The integrated circuit of claim 8, wherein the insulating material includes an oxide layer.

11. The integrated circuit of claim 8, further comprising an upper electrode, a lower electrode, and a gate, wherein the substrate is configured to provide a conductive path between the upper and lower electrodes when the gate is activated.

12. The integrated circuit of claim 11, wherein:
the substrate is of a first conductivity type and is lightly doped,
an upper portion of the substrate includes an upper diffusion region of a second conductivity type, the upper diffusion region being adjacent to a portion of an upper surface of the substrate and being heavily doped,
the annular diffusion region is of the second conductivity type,
and the annular groove extends into the substrate from the upper surface of the substrate.

13. The integrated circuit of claim 8, wherein the annular portion of the substrate is a first portion of the substrate, wherein the annular diffusion region is a first diffusion region, and wherein a second portion of the substrate includes a second diffusion region that is adjacent to the first portion of the annular groove and is of the first conductivity type.

14. The integrated circuit of claim 8, wherein the groove has a width of approximately 10 μm, and wherein the annular diffusion region has a depth that is less than half the thickness of the substrate.

15. The integrated circuit of claim 8, wherein the annular groove and the annular diffusion region are configured to prevent a voltage as high as 800 volts from causing breakdown of the integrated circuit.

16. The integrated circuit of claim 8, further comprising a vertical power component.

17. The integrated circuit of claim 16, wherein the vertical power component is a triac.

18. The integrated circuit of claim 16, wherein a guard distance between an upper portion of the vertical power component and the annular groove is less than 300 μm.

19. The integrated circuit of claim 8, wherein the insulating material electrically insulates the bottom portion of the undoped silicon from the annular diffusion region, and wherein the insulating material comprises an electrically insulating material.

20. An integrated circuit comprising:
a substrate, an annular portion of the substrate including an annular diffusion region formed adjacent to a portion of a lower surface of the substrate; and
an annular groove extending into the substrate in a direction of a thickness of the substrate, a first portion of the groove extending into the substrate without penetrating the annular diffusion region, a second portion of the groove penetrating the annular diffusion region, an insulating material isolating an interior of the groove from the annular diffusion region formed adjacent to the portion of the lower surface of the substrate.

21. The integrated circuit of claim 20, wherein the interior of the groove is filled with a non-metal material.

22. The integrated circuit of claim 20, wherein the interior of the groove is at least partially filled with undoped silicon.

23. The integrated circuit of claim 20, wherein the insulating material includes an oxide layer.

24. The integrated circuit of claim 20, further comprising an upper electrode, a lower electrode, and a gate, wherein the substrate is configured to provide a conductive path between the upper and lower electrodes when the gate is activated.

25. The integrated circuit of claim 24, wherein:
the substrate is of a first conductivity type and is lightly doped,
an upper portion of the substrate includes an upper diffusion region of a second conductivity type, the upper diffusion region being adjacent to a portion of an upper surface of the substrate and being heavily doped,
the annular diffusion region is of the second conductivity type, and
the annular groove extends into the substrate from the upper surface of the substrate.

26. The integrated circuit of claim 20, wherein the annular portion of the substrate is a first portion of the substrate, wherein the annular diffusion region is a first diffusion region, and wherein a second portion of the substrate includes a second diffusion region that is adjacent to the first portion of the annular groove, is of the first conductivity type, and is heavily doped.

27. The integrated circuit of claim 20, wherein the groove has a width of approximately 10 μm, and wherein the annular diffusion region has a depth that is no more than half the thickness of the substrate.

28. The integrated circuit of claim 20, wherein the annular groove and the annular diffusion region are configured to prevent a voltage as high as 800 volts from causing breakdown of the integrated circuit.

29. The integrated circuit of claim 20, further comprising a vertical power component.

30. The integrated circuit of claim 29, wherein the vertical power component is a triac.

31. The integrated circuit of claim 29, wherein a guard distance between an upper portion of the vertical power component and the annular groove is less than 300 µm.

32. The integrated circuit of claim 20, wherein the insulating material electrically isolates the interior of the groove from the annular diffusion region, and wherein the insulating material comprises an electrically insulating material.

* * * * *